United States Patent [19]

Kareem et al.

[11] Patent Number: 4,843,309

[45] Date of Patent: Jun. 27, 1989

[54] WAVEFORM TIMING ALIGNMENT SYSTEM FOR DIGITAL OSCILLOSCOPES

[75] Inventors: Arif Kareem; George S. Walker; Daniel G. Knierim, all of Beaverton, Oreg.

[73] Assignee: Tektronix, Inc., Beaverton, Oreg.

[21] Appl. No.: 171,060

[22] Filed: Mar. 21, 1988

[51] Int. Cl.$^4$ .................. G01R 25/00; G01R 25/04
[52] U.S. Cl. ........................ 324/121 R; 324/77 G; 340/722; 364/819
[58] Field of Search .............. 342/108, 145, 189; 364/728, 819; 324/77 G, 77 H, 121 R; 340/722

[56] References Cited

U.S. PATENT DOCUMENTS

| | | | |
|---|---|---|---|
| 3,798,604 | 3/1974 | Knipers et al. | 324/121 R |
| 3,965,419 | 6/1976 | Paiva | 324/121 R |
| 4,123,705 | 10/1978 | Olson | 324/121 R |
| 4,195,252 | 3/1980 | Roberts | 324/121 R |
| 4,224,679 | 9/1980 | Nossen et al. | 364/819 |
| 4,257,043 | 3/1981 | Tsuchiko | 324/121 R |
| 4,399,512 | 8/1983 | Soma et al. | 340/722 |
| 4,540,982 | 9/1985 | Jalovec | 324/121 R |
| 4,561,068 | 12/1985 | Kindler | 364/819 |
| 4,581,767 | 4/1986 | Monsen | 324/776 |

Primary Examiner—Reinhard J. Eisenzopf
Assistant Examiner—W. Burns
Attorney, Agent, or Firm—Mark M. Meininger; Peter J. Meza

[57] ABSTRACT

A method and an apparatus detect the presence of and correct for timing misalignment between waveforms acquired by digital oscilloscopes. In a preferred embodiment, a digital oscilloscope (50) includes a waveform alignment system (60) that receives a first waveform (86) and a similar second waveform (88) of a periodic electrical signal. A digital signal processor (80) of the waveform alignment system generates an autocorrelation value in connection with the first waveform and a first cross-correlation value in connection with the first and second waveforms and compares the values to determine whether they differ by more than a preselected tolerance, thereby to detect a timing misalignment between the first and second waveforms. Upon detection of a timing misalignment, the digital signal processor computes a shifted second waveform by changing the timing relationship of the second waveform relative to the first waveform and generates a second cross-correlation value in connection with the first waveform and the shifted second waveform. The digital signal processor shifts the second waveform relative to the first waveform such that the second cross-correlation value differs from the autocorrelation by less than the preselected tolerance, thereby to correct the timing misalignment.

12 Claims, 3 Drawing Sheets

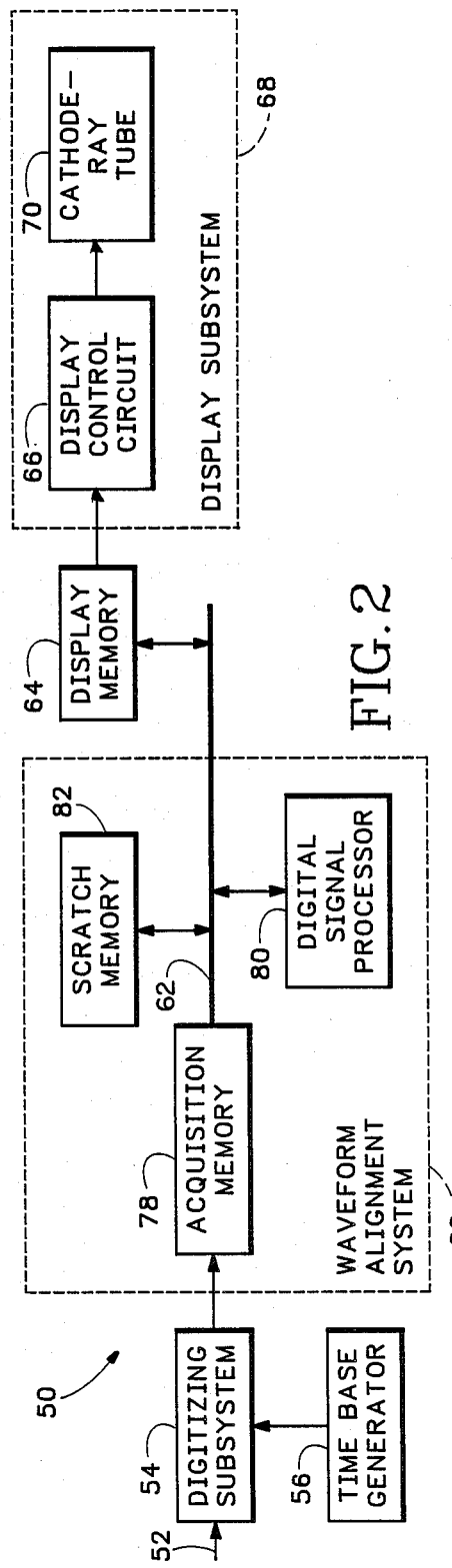
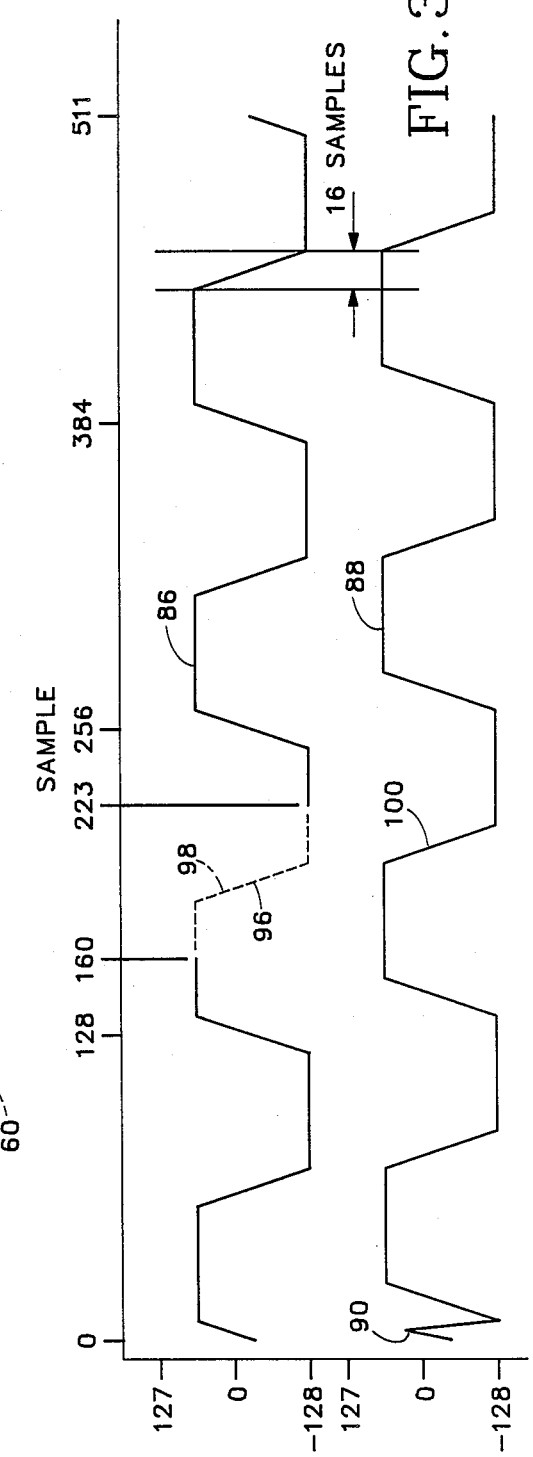

WAVEFORM TIMING ALIGNMENT SYSTEM FOR DIGITAL OSCILLOSCOPES

TECHNICAL FIELD

The present invention relates to digital oscilloscopes and, in particular, to a system for achieving temporal alignment of waveforms acquired by such oscilloscopes.

BACKGROUND OF THE INVENTION

A conventional digital oscilloscope takes discrete periodic samples of multiple analog input signals and processes the samples to render on a display screen light images of the input signals. FIG. 1 is a schematic representation of a prior art method by which one type of digital oscilloscope acquires multiple similar waveforms 10a–10c of a continuous-wave sinusoidal analog signal 12. Waveforms 10a–10c are formed by multiple discrete voltage samples acquired at similar times during successive cycles of analog signal 12. Corresponding voltage samples are taken at similar times during each of the waveform portions and are identified by identical reference numerals and lower case suffixes, the latter of which indicates the particular waveforms. For example, samples 14a, 14b, and 14c and samples 34a, 34b, and 34c represent two different groups of three corresponding samples. The formation of a digital signal is described below by way of example mainly with reference to waveform 10a.

Waveform 10a is represented by a data record that includes digital words representing multiple discrete voltage samples 14a–34a acquired during an acquisition period 36a. Samples 14a–34a represent the measured voltage amplitude values of analog signal 12 at periodic time intervals. The measured amplitude values typically form the vertical component of a display waveform rendered on the display screen of the digital oscilloscope. The horizontal component of the display waveform is typically formed by a time base sweep representing an acquisition period.

Acquisition period 36a begins at the end of a trigger system reset period 38a in response to a triggering event 42a. Triggering event 42a occurs after reset period 38a when analog signal 12 crosses a preselected trigger voltage level 44 with a slope of a predetermined polarity.

Analog signal 12 typically includes an a periodic noise component (not shown) characterized as a random variation in the voltage amplitude (i.e., the vertical component) of analog signal 12. Digital storage oscilloscopes of certain types correlate corresponding samples of waveforms 10a–10c and compute for each group of them an average voltage amplitude, thereby to form a display waveform having a voltage amplitude representing the average voltage amplitudes computed for different times in a cycle of analog signal 12. The averaging of corresponding samples can form a display waveform having a better vertical resolution (i.e., signal-to-noise ratio) than the vertical resolution of each of the acquired waveforms 10a–10c. The reason is that the averaging of relatively large numbers of corresponding samples tends to "average out" the noise component of analog signal 12.

In an electrically noisy environment, however, the voltage amplitude of the noise component of analog signal 12 can be comparable to that of its periodic signal component. Such a noise component could cause the voltage amplitude of analog signal 12 to cross trigger voltage level 44 at random intervals, thereby erroneously triggering any of the acquisition periods 36a–36c. Such an erroneous triggering results in a time misalignment or offset of samples otherwise corresponding to one another. The correlation of corresponding samples during averaging would, therefore, be improperly performed and, as a consequence, would result in the formation of different display waveforms that do not accurately represent analog signal 12. Moreover, the different display waveforms could cause the image representing analog signal 12 to appear unstable, a condition that is sometimes called "trigger jitter."

SUMMARY OF THE INVENTION

An object of this invention is, therefore, to provide a system for achieving temporal alignment of waveforms acquired by digital oscilloscopes.

Another object of this invention is to provide such a system that promotes the reduction of trigger jitter in digital oscilloscopes.

A further object of this invention is to provide such a system that facilitates reliable operation of a digital oscilloscope in an electrically noisy environment.

The present invention is a method of and an apparatus for achieving temporal alignment of waveforms acquired by digital oscilloscopes. By temporally aligning acquired waveforms, this invention can reduce trigger jitter and allow a digital oscilloscope to operate in an electrically noisy environment.

In a preferred embodiment, a digital storage oscilloscope acquires first and second data records that represent respective first and second similar waveforms of a periodic electrical signal. A waveform alignment system included as part of the oscilloscope generates an autocorrelation value is in connection with the first waveform and a cross-correlation value in connection with the first and second waveforms. The autocorrelation value is an approximation to the autocorrelation of the first waveform, and the cross-correlation value is an approximation to the cross-correlation of the first and second waveforms.

The waveform alignment system compares the auto-correlation value with the cross-correlation value to determine whether the values differ by more than a preselected tolerance. A difference between such values of more than the preselected tolerance represents a timing misalignment between the first and second waveforms. The magnitude of the difference between the autocorrelation value and cross-correlation value is proportional to the amount of timing misalignment between the first and second waveforms. Such a timing misalignment can be caused, for example, by an erroneous triggering event.

Whenever the autocorrelation value and cross-correlation value differ by more than the preselected tolerance, the waveform alignment system of the present invention adjusts the timing alignment between the first and second waveforms and generates a new cross-correlation value for the realigned first and second waveforms. The timing alignment between the first and second waveforms is adjusted such that the new cross-correlation value differs from the autocorrelation value by less than the preselected tolerance, thereby correcting the waveform timing misalignment caused by a triggering error.

Additional objects and advantages of the present invention will be apparent from the following detailed description of a preferred embodiment thereof, which proceeds with reference to the accompanying drawings.

BRIEF DESCRIPTION OF THE DRAWINGS

FIG. 2 is a simplified block diagram of a digital oscilloscope that includes a waveform alignment system of the present invention.

FIG. 3 is a diagram showing the timing alignment between two exemplary acquired waveforms.

DETAILED DESCRIPTION OF THE PREFERRED EMBODIMENT

Figure 1:
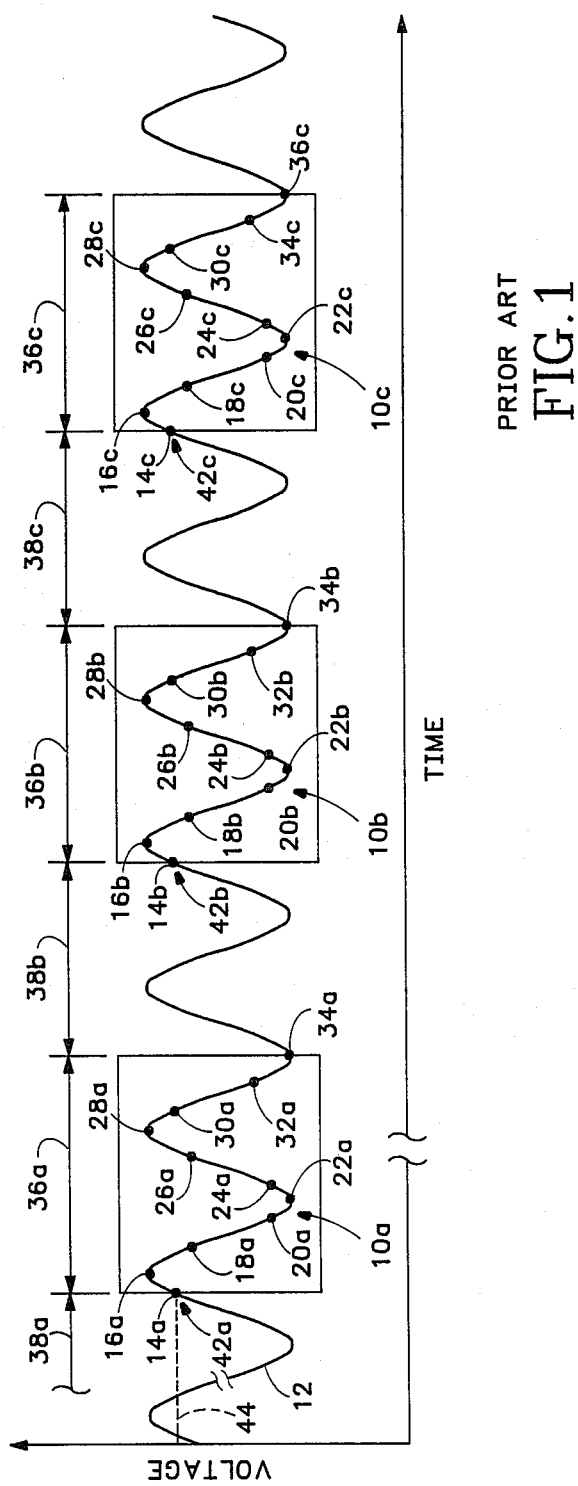
FIG. 1 shows a continuous-wave sinusoidal signal comprised of three waveforms acquired and processed in the form of discrete voltage samples in accordance with a prior art method by a digital oscilloscope.

FIG. 2 shows a digital storage oscilloscope 50 having an input terminal 52 that receives, for example, a continuous-wave analog voltage signal having a periodic signal component and an a periodic noise component. A digitizing subsystem 54 receives the analog signal and generates at periodic intervals 8-bit digital words that represent samples of the voltage amplitude of the analog signal.

Digitizing subsystem 54 includes an analog-to-digital converter (not shown) that acquires multiple voltage samples of the analog signal during an acquisition period. The acquisition period is started or concluded by a triggering event, the nature of which depends upon a selected one of a variety of possible triggering modes. By way of example, the acquisition period begins with a triggering event that occurs at the end of a trigger system reset period. The triggering event occurs when the voltage amplitude of the analog signal crosses a preselected trigger voltage with a slope of a preselected polarity. It will be appreciated, however, that triggering events could alternatively be referenced to signals other than the analog signal being measured by oscilloscope 50.

During each acquisition period, a time base generator 56 develops repetitive sample timing signals that establish the rate at which the voltage samples are acquired. The multiple samples acquired during an acquisition period form a data record that represents the analog signal waveform. Since the analog signal includes a periodic signal component, digitizing subsystem 54 acquires multiple data records that represent multiple, similar waveforms of the analog signal. The multiple, similar waveforms are averaged to form a display waveform that is rendered on the display screen (not shown) of oscilloscope 50, as described below in greater detail.

Digitizing subsystem 54 delivers to a waveform alignment means or system 60 the data records that represent the multiple waveforms. Alignment system 60 identifies and corrects timing differences associated with corresponding samples of the analog signal waveforms. Such differences can be caused by triggering errors that introduce timing misalignments between different ones of the analog signal waveforms.

After identifying and correcting any timing misalignments between the analog signal waveforms, alignment system 60 generates a data record that represents a display waveform and delivers the display waveform data record via a data bus 62 to a display memory 64. A display control circuit 66 of a display subsystem 68 obtains the data record from display memory 64. Display control circuit 66 generates in accordance with the display waveform data record deflection signals by which a cathode-ray tube 70 forms an image representing the analog signal.

Alignment system 60 includes an acquisition memory circuit 78 that functions as an input buffer for the data records acquired by digitizing subsystem 54. Acquisition memory 78 communicates via data bus 62 with a digital signal processor 80 that performs data manipulations by which waveform timing misalignments are identified and corrected and by which the display waveform data record is generated. Digital signal processor 80 stores intermediate results of its data manipulations in a temporary or "scratch" memory 82 that is in data communication with data bus 62.

FIG. 3 shows an exemplary first waveform 86 and a similar exemplary second waveform 88 that are acquired by oscilloscope 50 during two different acquisition periods. Waveforms 86 and 88 represent portions of a continuous-wave analog signal having a periodic signal component that resembles a clipped triangle wave. Waveform 88 includes an exemplary noise spike or component 90 that causes an erroneous triggering event and thereby initiates the acquisition of waveform 88.

Each of the data records that represent waveforms 86 and 88 comprises 512 samples that are acquired by digitizing subsystem 54. Each sample is an 8-bit digital word having a value of between $-128$ and $+127$. The digital values represent different voltage amplitudes for different voltage ranges that are preselectable by the oscilloscope operator. It will be appreciated that the data records could include different numbers of samples and digital words having different numbers of binary bits.

With reference to FIGS. 2 and 3, digitizing subsystem 54 acquires the data records representing waveforms 86 and 88 during respective first and second acquisition periods. The data records are stored in acquisition memory 78 and are available via data bus 62 to digital signal processor 80. As a result of the erroneous triggering event caused by noise spike 90, waveform 88 leads waveform 86 by an amount of time corresponding t samples and is, therefore, misaligned with waveform 86.

Digital signal processor 80 generates in connection with waveform 86 an autocorrelation value $R_{xx}$ that provides a "signature" of waveform 86. The autocorrelation value is preferably an approximation of, but could be equal to, the autocorrelation of waveform 86. To generate the autocorrelation value $R_{xx}$, digital signal processor 80 identifies an edge 96 of waveform 86. Edge 96 preferably has a mean value and a slope with an absolute value that are greater than the corresponding mean values and absolute slope values for other edges in waveform 86. Digital signal processor 80 identifies edge 96 by computing the slope and mean value of successive pairs of samples of waveform 86. The samples of each pair are separated by an interval of about 1/16 the length of waveform 86 (i.e., about 32 samples) and are positioned within the first ¾ of the length of waveform 86 (i.e., among samples 0-383). The evaluation of the pairs proceeds successively in increments of one sample from a first pair of samples 0 and 31 to a last pair of samples 352 and 383. The pair of samples of waveform 86 that has in combination the greatest mean and absolute slope values is designated as edge 96. Whenever several portions of waveform 86 have the greatest mean and absolute slope values, digital signal processor 80 designates one, for example, the first, such pair as edge 96. For purposes of clarity, the fourth such pair is shown as edge 96 in FIG. 3.

Once edge 96 is identified, digital signal processor 80 designates a "slice" 98 of waveform 86. Slice 98 is positioned symmetrically about edge 96 and comprises 1/8 of the total number of samples (i.e., 64 samples) that form waveform 86. The autocorrelation value $R_{xx}$ is calculated with respect to slice 98, which will typically provide an accurate characterization of waveform 86.

The autocorrelation value $R_{xx}$ generated by digital signal processor 80 is the first-order or peak autocorrelation value. The 64 samples that form slice 98 are designated $x_1, x_2, x_3, .., x_{64}$ and represent samples 160-223, respectively, of waveform 86. The autocorrelation value $R_{xx}$ that is generated in connection with waveform 86 is, therefore, represented as:

$$R_{xx} = x_1 x_1 + x_2 x_2 + x_3 x_3 + \ldots + x_{64} x_{64}.$$

The autocorrelation value $R_{xx}$ is stored in scratch memory 82 as a signature of waveform 86.

Digital signal processor 80 generates in connection with waveforms 86 and 88 a cross-correlation value $R_{xy}$. The cross-correlation value is preferably an approximation of, but could be equal to, the cross-correlation of waveforms 86 and 88. To generate the cross-correlation value $R_{xy}$, digital signal processor 80 designates a slice 100 of waveform 88 that corresponds in a sample-by-sample manner to slice 98 of waveform 86. As a result, slice 100 includes 64 samples that are designated $y_1, y_2, y_3, .., y_{64}$ and represent samples 160-223, respectively, of waveform 88. The cross-correlation value $R_{xy}$ generated by digital signal processor 80 is the first-order or peak cross-correlation value and is represented as:

$$R_{xy} = x_1 y_1 + x_2 y_2 + x_3 y_3 + \ldots + x_{64} y_{64}.$$

Digital signal processor 80 recalls the autocorrelation value $R_{xx}$ from scratch memory 82 and compares the value with the cross-correlation value $R_{xy}$. Differences between the magnitudes of the autocorrelation and cross-correlation values are proportional to the amount of timing misalignment between waveforms 86 and 88 and are indicative of triggering errors.

To improve the accuracy by which digital signal processor 80 identifies timing misalignments of relatively small amounts or between waveforms represented by digital words of relatively large values (e.g., waveforms positioned near the top of the oscilloscope display screen), digital signal processor 80 calculates a mean value M of the samples that comprise slice 98. Prior to the calculation of the autocorrelation value $R_{xx}$ and the cross-correlation value $R_{xy}$, the mean value is subtracted from each one of the sample values $x_1, x_2, x_3, .., x_{64}$ and $y_1, y_2, y_3, .., y_{64}$. The subtraction of the mean value M from each of the sample values results in autocorrelation and cross-correlation values of relatively small magnitudes. Differences between such small autocorrelation and cross-correlation values more accurately identify relatively small timing misalignments because a small difference is more discernable between two small values than it is between two large values. For example, the difference between the values 100 and 101 represents only 1% of the magnitudes of the values; whereas, the same difference between the values 1 and 2 represents up to 100% of the magnitudes of the values. Such a 100% difference is much more discernable than a 1% difference.

Whenever the autocorrelation and cross-correlation values differ by more than a preselected tolerance, waveforms 86 and 88 are classified as being misaligned As a result, the samples that comprise slice 100 of waveform 88 are reassigned by an increment of one sample so that the samples $y_1, y_2, y_3, \ldots, y_{64}$ represent samples 161-224, respectively. Such a reassignment corresponds to shifting slice 100 by one sample interval relative to slice 98. An updated or new cross-correlation value $R_{xy}$ is calculated in connection with the shifted slice 100 and slice 98. The new cross-correlation value $R_{xy}$ is compared with the autocorrelation value $R_{xx}$ to determine whether the values differ by more than the preselected tolerance.

The sequence of reassigning the samples that comprise slice 100, generating a new cross-correlation value $R_{xy}$, and comparing the new cross-correlation value $R_{xy}$ with the autocorrelation value $R_{xx}$ is repeated until the difference between the autocorrelation value $R_{xx}$ and the new cross-correlation value $R_{xy}$ is less than the preselected tolerance, thereby aligning slice 100 with slice 98. Whenever the difference between each one of the new cross-correlation values $R_{xy}$ and the autocorrelation value $R_{xx}$ is greater than the preselected tolerance, the alignment by which the difference is the least is identified, thereby establishing a "closest" or "best fit" alignment between slice 100 and slice 98.

The reassigning of the samples that comprise slice 100 of waveform 88 proceeds such that slice 100 is alternately shifted to the right and left by increasing numbers of samples. In particular, samples $y_1, y_2, y_3, \ldots, y_{64}$ originally represent samples 160-223, respectively, of waveform 88. After the first reassignment of samples described above, the samples $y_1, y_2, y_3, \ldots, y_{64}$ represent samples 161-224, respectively. In a second reassignment, the samples $y_1, y_2, y_3, \ldots, y_{64}$ represent samples 159-222, respectively. In a third reassignment, the samples $y_1, y_2, y_3, \ldots, y_{64}$ represent samples 162-225, respectively. The reassignment of the samples $y_1, y_2, y_3, \ldots, y_{64}$ proceeds in this "oscillating" sequence until the difference between the autocorrelation value $R_{xx}$ and the cross-correlation value $R_{xy}$ is less than the preselected tolerance.

The amount by which slice 100 is shifted relative to slice 98 to obtain a difference less than the preselected tolerance is designated an "aligning" amount. To correct a timing misalignment between waveforms 86 and 88, digital signal processor 80 shifts waveform 88 relative to waveform 86 by the aligning amount established by slices 98 and 100. For example, a relatively small tolerance could result in waveform 88 being shifted to the left by 16 samples. Such a shift would generate 16 "empty" samples on the right end of waveform 88, which samples are assigned null values and correspond to blanked portions of the display waveform. The display waveform is then formed by generating average values for corresponding ones of the nonblanked samples of the aligned waveforms 86 and 88.

The preselected tolerance is a user-selectable quantity that allows waveforms 86 and 88 to be aligned although they include different a periodic noise components. In addition to the noise spike 90 that causes the triggering error, waveforms 86 and 88 typically include different noise components that would prevent the autocorrelation value $R_{xx}$ from being equal to the cross-correlation value $R_{xy}$ even if the waveforms were perfectly aligned. The preselected tolerance provides, therefore, a means for compensating for different noise components on waveforms 86 and 88. In particular, larger preselected tolerances compensate for noise components of larger magnitudes. The preselected tolerance also allows a user to accept a nonzero but imperceptible amount of misalignment between waveforms 86 and 88 to thereby increase the rate at which the waveforms are aligned.

Figure 4:
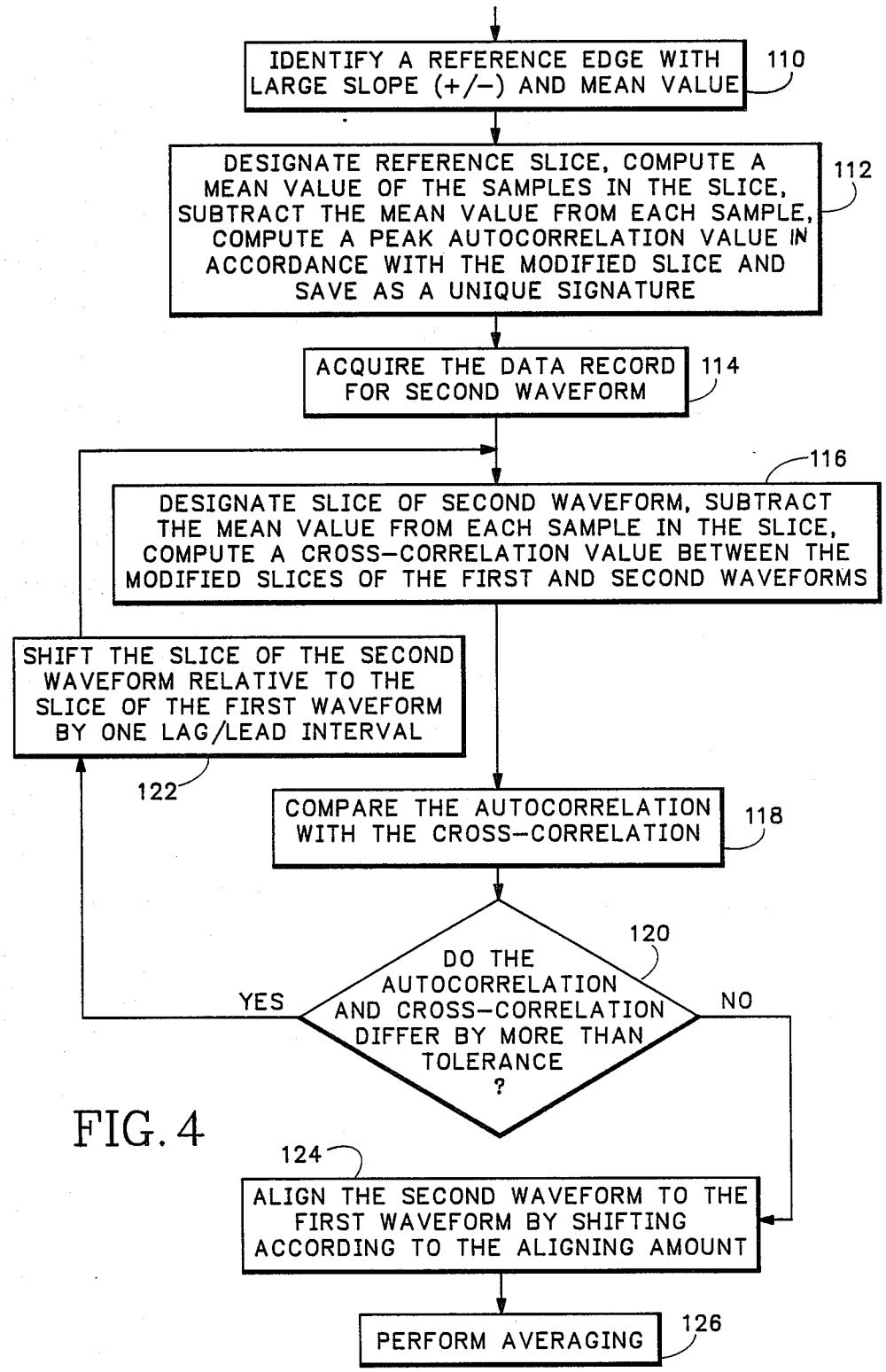
FIG. 4 is a flow diagram showing the operation of the waveform alignment system of FIG. 2.

FIG. 4 is a flow diagram showing with reference to FIG. 2 the process steps by which misalignment between waveforms 86 and 88 is corrected. It will be appreciated that these process steps can be programmed into and performed by a computer or microprocessor or, alternatively, be performed by a dedicated electronic circuit.

Process block 110 indicates the identification of a reference edge 96 of waveform 86. The reference edge preferably has a large mean value and a slope having a large absolute value. The step represented by process block 110 is accessed upon the completion of the acquisition of waveform 86, which is designated a reference waveform.

Process block 112 indicates the designation about edge 96 of a reference slice 98 of ⅓ the number of samples of waveform 86. Digital signal processor 80 computes a mean value M of the samples that form reference 98 and subtracts the mean value M from each of the samples to generate a modified reference slice 98. Digital signal processor 80 then computes a peak autocorrelation value $R_{xx}$ in connection with modified reference slice 98, and delivers the value to scratch memory 82 as a unique signature of reference waveform 86.

Process block 114 indicates the acquisition of the data record representing waveform 88.

Process block 116 indicates the designation of slice 100 of waveform 88, the subtraction by digital signal processor 80 of the mean value M from each one of the samples that form slice 100, and the computation by digital signal processor 80 of a cross-correlation value $R_{xy}$ in connection with modified reference slice 98 of reference waveform 86 and modified slice 100 of waveform 88.

Process block 118 indicates the comparison by digital signal processor 80 of the cross-correlation value $R_{xy}$ to the autocorrelation value $R_{xx}$.

Decision block 120 represents an inquiry as to whether the autocorrelation value $R_{xx}$ and cross-correlation value $R_{xy}$ differ by more than the preselected tolerance. If the values differ by more than the preselected tolerance, decision block 120 proceeds to process block 122. If the values differ by the preselected tolerance or less, decision block 120 proceeds to process block 124.

Process block 122 indicates the shifting of slice 100 of waveform 88 (i.e., the reassignment of samples that form slice 100) by one sample interval relative to reference slice 98 of reference waveform 86. The sample interval by which slice 100 is shifted will alternately be a leading interval and a lagging interval. Process block 122 then returns to process block 116.

Process block 124 indicates the alignment of waveform 88 with reference waveform 86 by the shifting of waveform 88 (i.e., the reassignment of samples that form waveform 88) in accordance with the aligning amount by which slice 100 is aligned with reference slice 98. The alignment of waveform 88 with reference waveform 86 corrects the timing misalignment related to the triggering error caused by noise spike 90.

Process block 126 indicates the computation of averages for corresponding samples of aligned waveforms 86 and 88, thereby to provide a display waveform that is delivered to display memory 64.

The present invention allows waveforms 86 and 88 to be aligned very quickly so that the display waveform is generated and displayed in a "real-time" fashion. In particular, employing slices 98 and 100 to determine the aligning amount and calculating only the peak autocorrelation and cross-correlation values allows waveforms 86 and 88 to be aligned quickly and relatively accurately. It will be appreciated, however, that higher-order levels of the autocorrelation and cross-correlation values could be calculated to more accurately align waveforms 86 and 88. Similarly, slices 98 and 100 could include larger portions of the respective waveforms 86 and 88 to more accurately characterize the waveforms. Such calculations could, however, interfere with the real-time generation of the display waveform.

It will be obvious to those having skill in the art that many changes may be made to the details of the above-described preferred embodiment of the present invention without departing from the underlying principles thereof. For example, more than two waveforms can be aligned by means of this invention. Moreover, generating interpolation samples between acquired samples could be employed to increase the resolution by which a waveform is represented and thereby improve the accuracy by which waveforms are aligned. The scope of the present invention should be determined, therefore, only by the following claims.

We claim:

1. In a digital oscilloscope that acquires first and second data records representing respective first and second similar waveforms of a periodic signal and processes the first and second waveforms to form a display waveform for rendering on a display screen, a method of achieving temporal alignment of the first and second waveforms, comprising:

generating an autocorrelation value in connection with the first waveform;

generating a first cross-correlation value in connection with the first and second waveforms;

determining whether the autocorrelation value and first cross-correlation value differ by more than a preselected tolerance to detect temporal misalignment between the first and second waveforms; and upon detection of the misalignment, computing a shifted second waveform by changing the time relationship of the second waveform relative to the first waveform, and generating a second cross-correlation value in connection with the first waveform and the shifted second waveform, the second waveform being shifted such that the autocorrelation value and the second cross-correlation value differ by less than the preselected tolerance, whereby the first waveform and the shifted second waveform are in temporal alignment.

2. The method of claim 1 in which the autocorrelation value and the first and second cross-correlation values constitute peak autocorrelation and peak cross-correlation values, respectively.

3. The method of claim 1 in which the first waveform includes a first portion of less than the complete first waveform and the second waveform includes a second portion of less than the complete second waveform, and in which the autocorrelation and cross-correlation values are generated from the first and second portions.

4. The method of claim 3 in which the second portion is repetitively shifted by different amounts relative to the first portion, and a second cross-correlation value is generated and compared with the autocorrelation value each time the second portion is shifted, the second portion being repetitively shifted until the second portion is shifted by an aligning amount in which the second cross-correlation value generated in accordance with a shift of the aligning amount differs from the autocorrelation value by less than the preselected tolerance.

5. The method of claim 4 in which the second waveform is shifted relative to the first waveform by an amount equal to the aligning amount.

6. The method of claim 1 in which the shifted second waveform is represented by a data record, the method further comprising the step of averaging corresponding values included in the data records of the first waveform and the shifted second waveform, thereby to form the display waveform.

7. The method of claim 1 in which the first and second data records include samples of the respective first and second waveforms, the method further comprising:
generating a mean value in connection with preselected ones of the samples of the first data record;
subtracting the mean value from each of the preselected ones of the samples of the first data record and from each of preselected ones of the samples of the second data record to generate first and second sets of modified samples, respectively;
generating the autocorrelation value in accordance with the first set of modified samples; and
generating the cross-correlation value in accordance with the first and second sets of modified samples.

8. The method of claim 7 in which the shifted second waveform is represented by a data record that includes shifted samples of the second waveform, the method further comprising subtracting the mean value from each of preselected ones of the shifted samples to generate a third set of modified samples and generating the second cross-correlation value in accordance with first and third sets of modified samples.

9. The method of claim 1 in which the digital oscilloscope is a digital storage oscilloscope.

10. A digital oscilloscope, comprising:
a digitizing subsystem that acquires first and second data records that represent respective first and second similar waveforms of a periodic signal;
a display subsystem that forms in accordance with the first and second data records an image that represents the periodic signal; and misalignment
waveform alignment means for detecting a timing misalignment between the first and second waveforms and for aligning the first and second waveforms whenever such timing misalignment is detected including means for generating an autocorrelation value in connection with the first waveform; for generating a first cross-correlation value in connection with the first and second waveforms; and for comparing the autocorrelation value and the first cross-correlation value to determine whether they differ by more than a preselected tolerance, thereby to determine whether there is a timing misalignment between the first and second waveforms.

11. The oscilloscope of claim 10 in which the waveform alignment means further comprises means for designating a first portion of less than the complete first waveform and a second portion of less than the complete waveform and for generating the autocorrelation and cross-correlation values in accordance with the first and second portions.

12. The oscilloscope of claim 10 in which the waveform alignment means further comprises means for computing a shifted second waveform by changing the time relationship of the second waveform relative to the first waveform and for generating a second cross-correlation value in connection with the first waveform and the shifted second waveform, the second waveform being shifted such that the autocorrelation value and the second cross-correlation value differ by less than the preselected tolerance, thereby to achieve temporal alignment of the first and second waveforms.

* * * * *